United States Patent [19]
Hurley et al.

[11] Patent Number: 5,475,316
[45] Date of Patent: Dec. 12, 1995

[54] TRANSPORTABLE IMAGE EMISSION MICROSCOPE

[75] Inventors: Daniel T. Hurley, San Ramon; Ching-Lang Chiang, San Jose; Neeraj Khurana, Monte Sereno, all of Calif.

[73] Assignee: Hypervision, Inc., Fremont, Calif.

[21] Appl. No.: 174,943

[22] Filed: Dec. 27, 1993

[51] Int. Cl.⁶ .................................................. C23C 14/00
[52] U.S. Cl. .......................... 324/750; 324/251; 414/222; 250/310; 250/442.11
[58] Field of Search .................................. 250/310, 311, 250/442.11; 414/222; 324/751, 750; 358/106

[56] References Cited

U.S. PATENT DOCUMENTS

| | | | |
|---|---|---|---|
| 4,680,635 | 7/1987 | Khurawa | 358/241 |
| 4,722,298 | 2/1988 | Rubin | 118/715 |
| 4,755,874 | 7/1988 | Esrig | 358/106 |
| 4,772,846 | 9/1988 | Reeps | 324/751 |

OTHER PUBLICATIONS

"The Image Processing Book" John Russ pp. 278–293 1992 CRC Press.

*Primary Examiner*—Kenneth A. Wieder
*Assistant Examiner*—Mark Wardas
*Attorney, Agent, or Firm*—Townsend and Townsend and Crew

[57] ABSTRACT

An emission microscope is mounted on a transportable structure for use on a test floor and encloses or garages an entire automatic test equipment head to facilitate high-speed testing. Test procedures allow development of static/fixed defects over time. A video mask can be developed based on emission sites on known good devices so that only emission from defect sites of bad devices under test are shown.

6 Claims, 10 Drawing Sheets

TRANSPORTABLE IMAGE EMISSION MICROSCOPE

FIELD OF THE INVENTION

This invention relates generally to the field of testing semiconductor circuits and, more particularly, the invention relates to an improved transportable emission microscope for testing semiconductor circuits.

BACKGROUND OF THE INVENTION

It is well known that integrated circuits can suffer from a variety of failure mechanisms, some of which occur in process or under use conditions. Today's integrated circuits are both vertically and horizontally integrated and can incorporate multiple levels of metallization. Dimensional size of structure has dropped to 0.65 µ with 0.5 µ to 0.35 µ scaling anticipated shortly. The increased miniaturization has led to higher chip clock rates with speeds of 66 to 100 MHz fully achievable. To permit defect-free production, failure mechanisms must be precisely located within the complex three-dimensional structure of the circuit. Locating defects requires two types of instruments: sophisticated imaging systems and test equipment capable of exercising the circuit under normal clock operating rates.

U.S. Pat. No. 4,811,090 and earlier related U.S. Pat. Nos. 4,755,874 and 4,680,635 disclosed an image emission microscope which localizes defects in integrated circuits. The emission microscope is based on the principal of recombinant radiation. In an excess current drawing condition such as occurs during failure, electrons and holes in silicon recombine and relax, giving off a photon of light which is readily detected by specialized intensified CCD sensors (night vision equipment). Semiconductor manufacturers typically perform this technique on wafers and on delidded or decapsulated finished devices. The technique is utilized to locate the exact location of defects both on the chip face and from beneath overlying metalization, thereby permitting location of defects within the three-dimensional environment of the circuit. Spatial resolution is 0.5 µ. The technique provides evidence of defects such as latchup initiation sites, forward and reverse biasing of junctions, leakage, hot electron and dielectric related defects.

Prior art for biasing of the chip during such testing has generally consisted of two-channel DC power supplies or curve tracers, which provide basic power requirements to the chip. This method has not proven adequate for testing logic devices such as microprocessors and ASICs (Application Specific Integrated Circuits), and all memory devices. These devices require that the chip be exercized to perform certain functions before function related defects can be detected.

This parametric and software chip conditioning is performed by ATE (Automatic Test and Evaluation) production testers which combine precise chip level biasing with software capable of exercising the circuit. ATE equipment can send these test parameters (vectors) to the chip at functional real time clock rates. Many failures are detectable only when functionally evaluated at full chip overating speeds, and then only after an entire series of preceding vectors have been implemented.

ATE software is custom and device-specific. Defects which are detected while operating at full clock speed on these systems are routinely forwarded to failure analysis groups in order to localize the defects. The only current method for linking ATE equipment and an Emission Microscope is by remote cables. The device under test (DUT) is decapsulated or delidded to expose the die surface for emission inspection. The DUT is secured in a socket, placed on the stage of the Emission Microscope which in turn is completely enclosed in a light tight housing. Cables bring the test vectors from the ATE test head to the socket and the DUT. The distance between the ATE tester which is situated outside the light tight enclosure and the DUT is often greater than 6 to 10 feet. The transmission delay resulting from this length of electrical cable greatly limits the ATE signal repetition rate.

Alternately, many failure analysis groups utilize a less sophisticated tester. These testers attempt to simulate the software of the larger production tester, but do so by using different software, which performs a translation of the production tester software, and which performs algorithmic approximations of transmission delays caused by the cabling. The combination of essentially different software and conduction timing delays can make failure conditions both undetectable and non-reproducible. As a result, certain functional failures can never be completely analyzed.

The present invention is directed to a transportable emission microscope that can move freely on the test floor and which is capable of "garaging" the entire ATE test head and docking it in a light-tight manner directly to the stage of an emission microscope. In this way, the DUT is secured to the ATE test head just as it is when it is to be tested independently. By looping suspect test vectors repetitively in order to strobe the light emitted by the failure mechanism with a triggered emission sensor, an emission image can be generated which shows the failure sites. This provides for a significant reduction in the time required to localize the defect for failure analysis.

The docking emission microscope (DEMI) of the invention addresses the following problems:

1. It utilizes existing ATE tester software, the same software used to reveal the parametric failure.

2. The transportable emission microscope "garages" the ATE test head in a light-tight manner for docking to the emission microscope, bringing the DUT directly within the focal plane of the Emission Microscope objectives.

3. Once garaged and docked the chip can be exercised at actual clock speeds thereby reducing any uncertainty in the failure analysis. It eliminates the need, expense and unpredictability of custom cable sets.

4. A triggered camera is tied to the ATE tester and is controlled by ATE software to trigger the camera to turn on at the exact moment for emission detection. This provides for resolution of both static/fixed and dynamic/transient events that occur on these types of devices. By dynamically moving this window forward or backward over the list of test vectors it is possible to confirm the significance of a particular variable and its relationship to producing the emission being imaged.

SUMMARY OF THE INVENTION

It is the objective of this invention to provide an improved emission microscope with enhanced capabilities to detect and localize in-process and use-related defects in those integrated circuits which require both software and parametric test conditions (vectors) for defect detection and localization.

A further objective is a transportable, caster-mounted emission microscope designed for use on the test floor. This emission microscope has the capability to "garage"

(enclose) the entire ATE tester head, motherboard, and daughter board to facilitate high-speed testing.

A further objective is a light-tight docking mechanism to perform a secure mechanical attachment of the ATE test head to the emission microscope, and more particularly to maintain the totally dark enclosure necessary to form an emission microscope test environment.

A further objective is to permit direct access of the wafer, decapsulated die, or delidded die, in the test fixture (daughter board or probe card) of the ATE test head directly to the focal plane of the objectives of the emission microscope.

A further objective is the visualization of the emission sites by means of integration over time as the ATE tester loops the test vector set. A particular refinement is the use of a switching gain camera with gating capability. During illumination modes, this camera operates at low gain to facilitate clean low noise images. During emission testing the camera automatically switches to high gain, maximizing the detection of low photon count emissions by increasing the gain to the micro channel plate (amplifier) on the image intensifier. This is essential for utilizing the video compression equipment to be described for static defect detection.

In accordance with the invention, a camera (emission sensor) having a gated trigger allows the camera to be switched on by source code software commands from the ATE tester. This facilitates a dynamic test capability allowing the emission sites to produce a stroboscopic effect which can be integrated with time by the software imaging system producing an image of the defect site. While it is known that a variety of test vectors may switch on and saturate junctions producing light emissions that are not defect-related, having a gated camera triggered from the ATE tester provides exposure to the emission microscope sensor only during the test vector sequence when the suspected defect structures are capable of emitting light, thus allowing integration and detection over time.

A further feature of the invention is a static defect detection tool set incorporating two key elements. The first utilizes the above gated camera to produce a time slice sequence of the vector subset exposing the sensor over time. The video produced by the sensor is fed into a real time video compression board whose output is multiple frames which collectively act as a short video clip. Furthermore, software within the emission microscope allows for filtering and contrast of the first frame of the video sequence as is performed in accordance with U.S. Pat. No. 4,811,090, but the particular enhancement is the automatic filtering of each following frame. The resulting video shows the development of static/fixed defects over time and can be correlated to suspect test vector sequences through the gating.

Another feature of the emission microscope is the development of a video mask. The operator can identify three sites on each of two different parts, one known to be good and the other suspected to be defective. By using image triangulation to locate coordinate sites, the software allows the precise overlay of these images. It is anticipated that the good part may show emission sites that are not defective. These emissions are to be masked. The cursor is brought over the area which is to be masked. By comparing the background noise to the signal, the software identifies the unwanted emission by its signal amplitude. Pixels representing the unwanted emission are masked out and replaced pixel for pixel by the same area of the illuminated image. The result is that during image overlay between a good and bad part, only the defect sites are shown. This improvement is necessary when long test vector sequences are employed.

The features and advantages of this invention will be more readily apparent to a person of skill in the art from the following detailed description of a preferred embodiment given in conjunction with the following drawings.

DESCRIPTION OF THE PREFERRED EMBODIMENT

Figure 1:
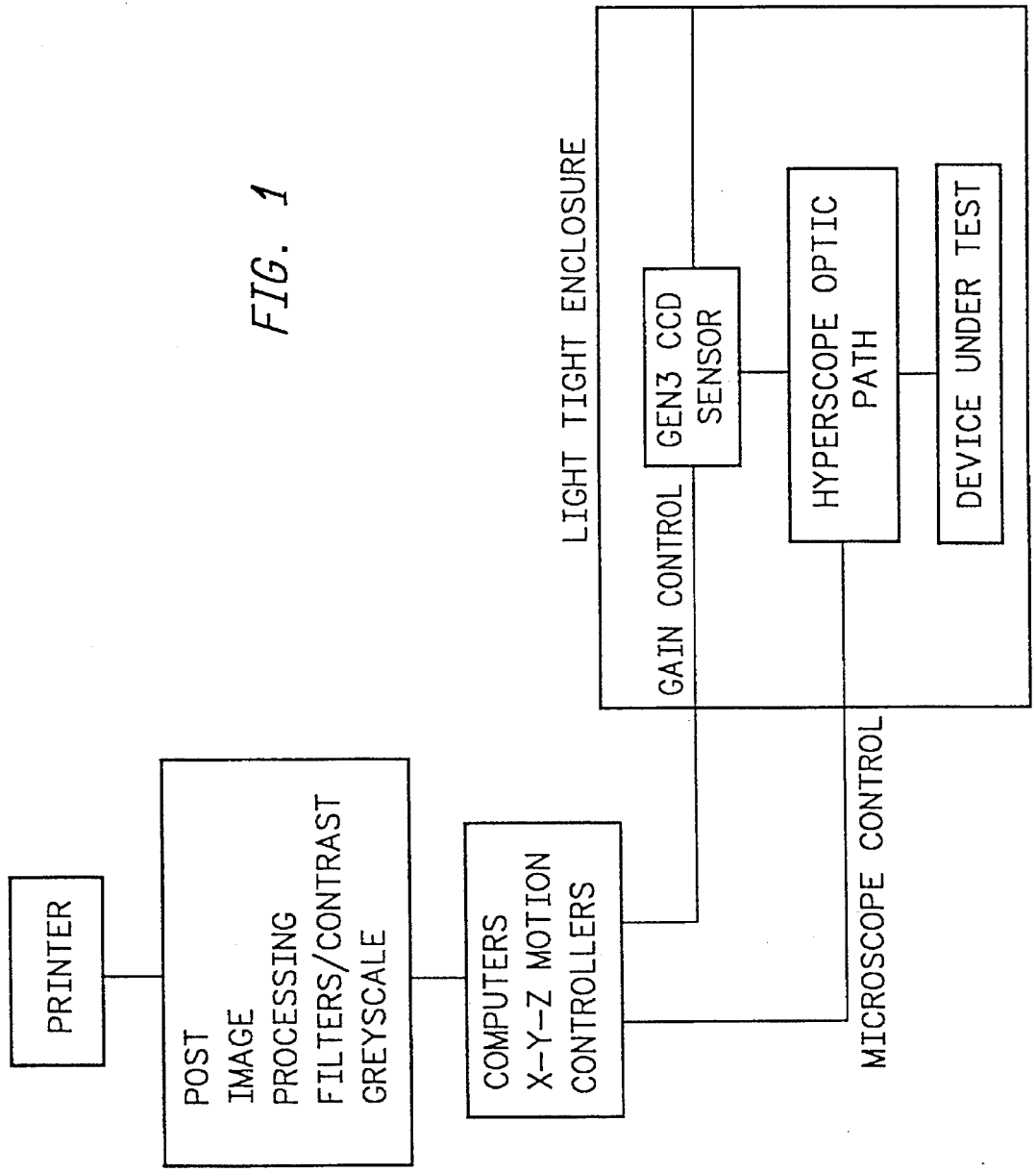
FIG. 1 is a block diagram of the general configuration of an Emission Microscope.
Figure 2B:
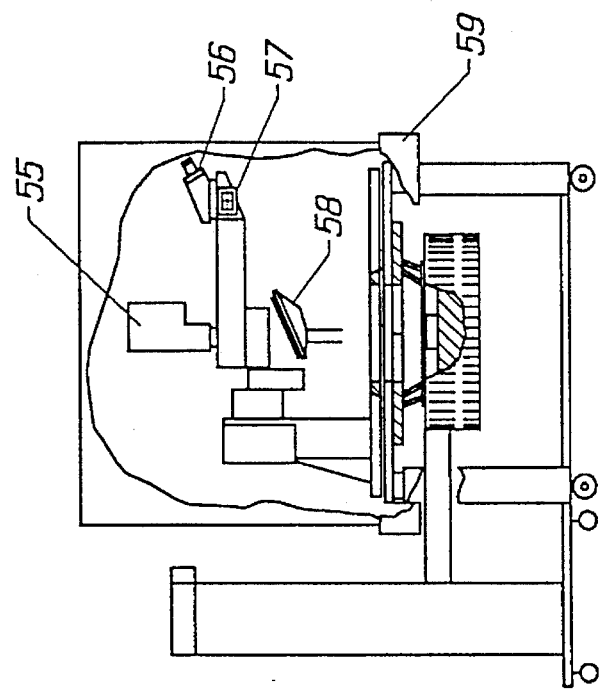
FIGS. 2A and 2B are side views of the DEMI Docking Emission Microscope showing the garaged and docked test head positions.
Figure 2A:
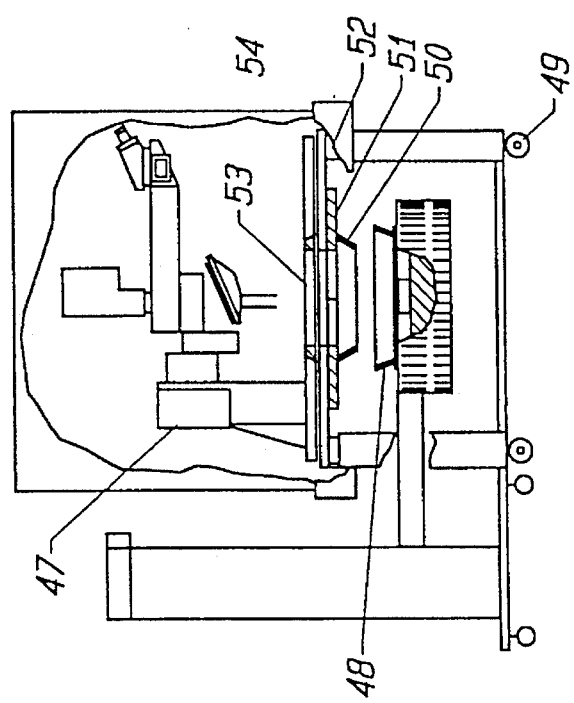
Figure 2D:
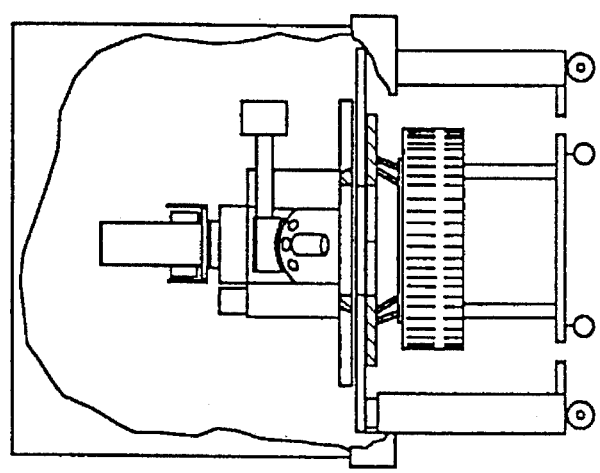
FIGS. 2C and 2D are front views of the DEMI Docking Emission Microscope showing the garaged and docked test head positions.
Figure 2C:
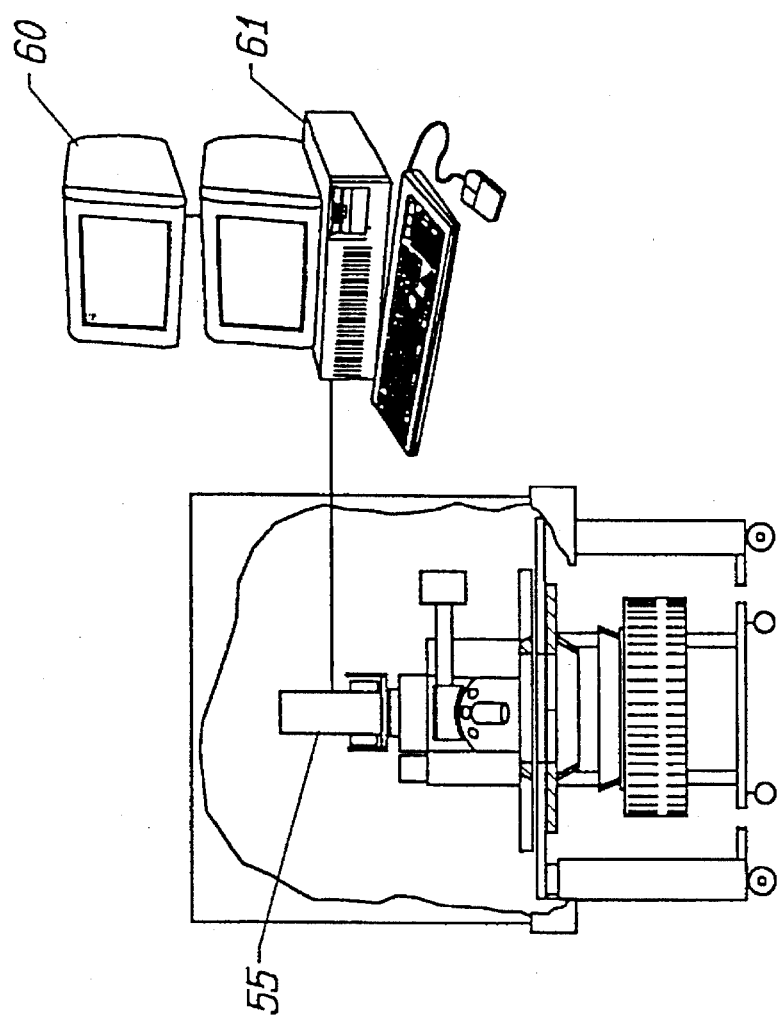
Figure 2E:
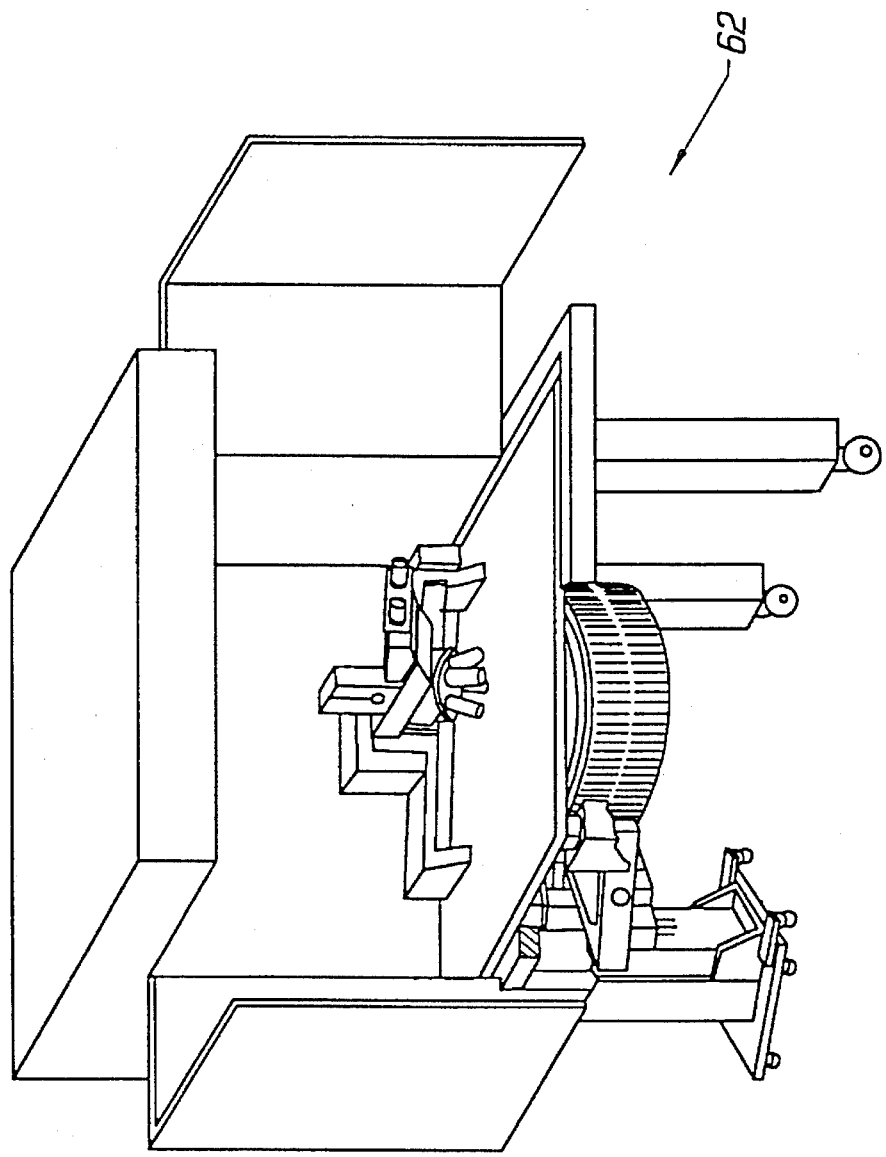
FIG. 2E is a cutaway view of the Emission Microscope enclosure and isolation bench.
Figure 3B:
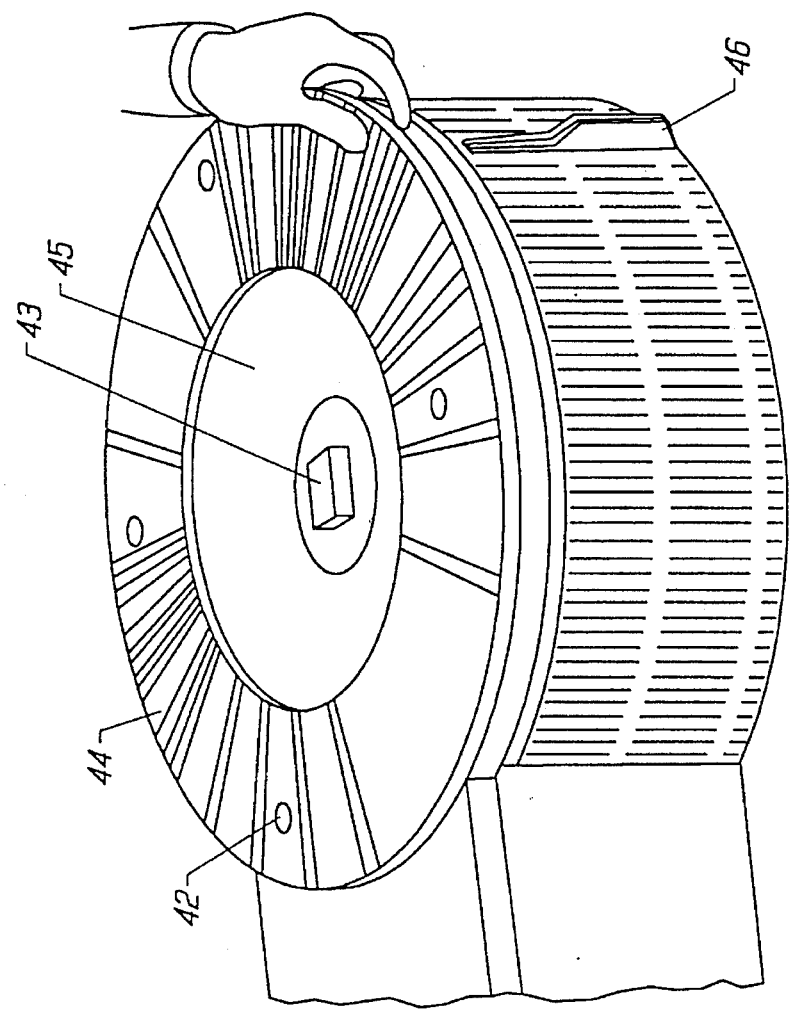
FIGS. 3A and 3B are a perspective view and a detailed view of the ATE Automatic Test and Evaluation Test Head.
Figure 3A:
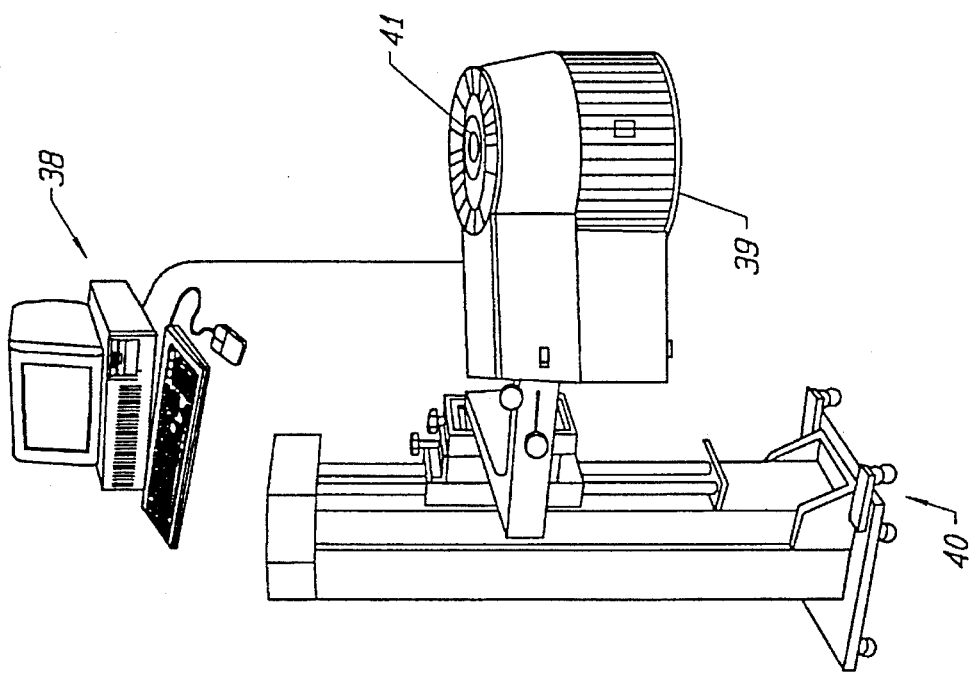
Figure 4:
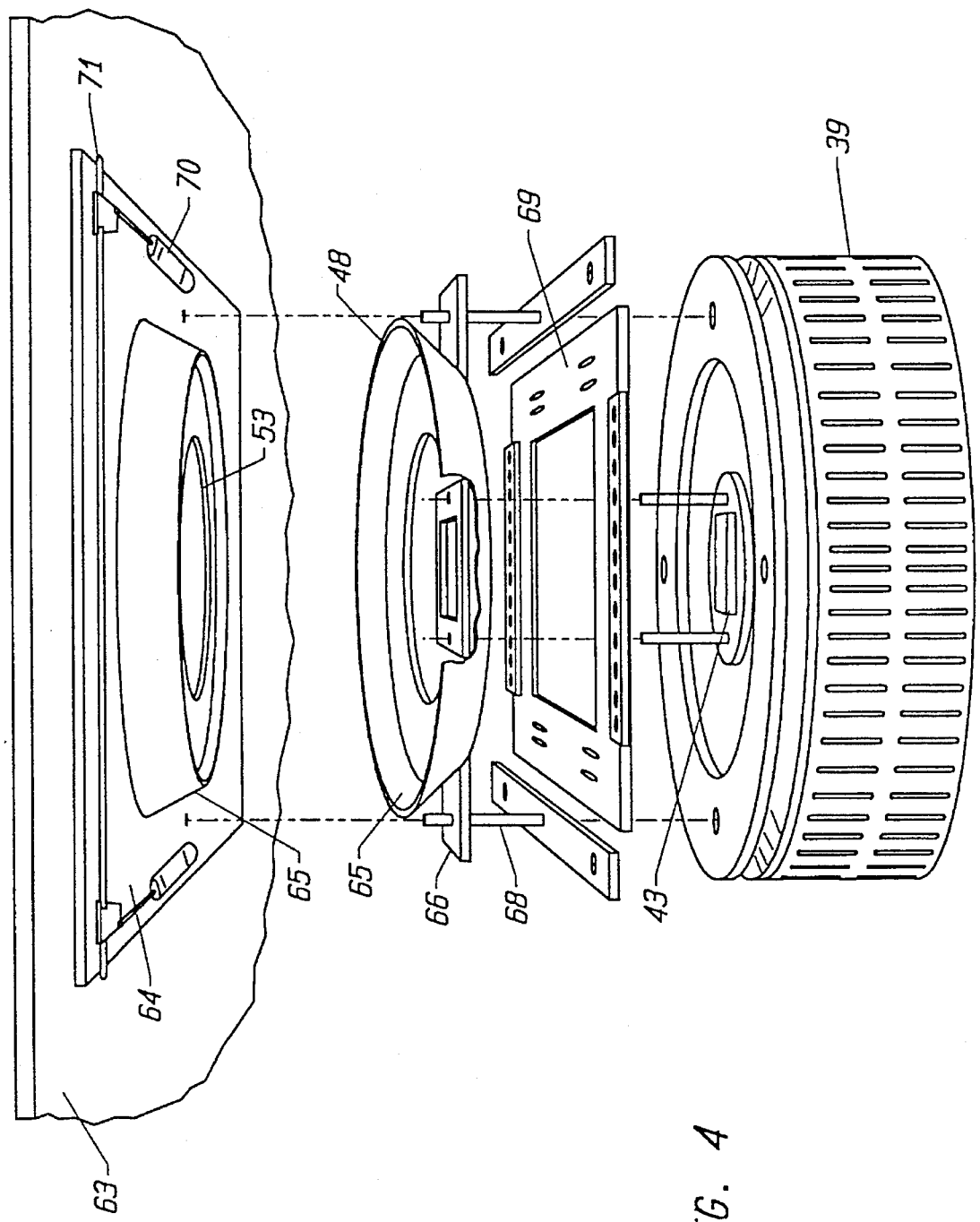
FIG. 4 is a detailed exploded view of the docking interfaces and light tight collar assembly essential for docking to the Emission Microscope.
Figure 5:
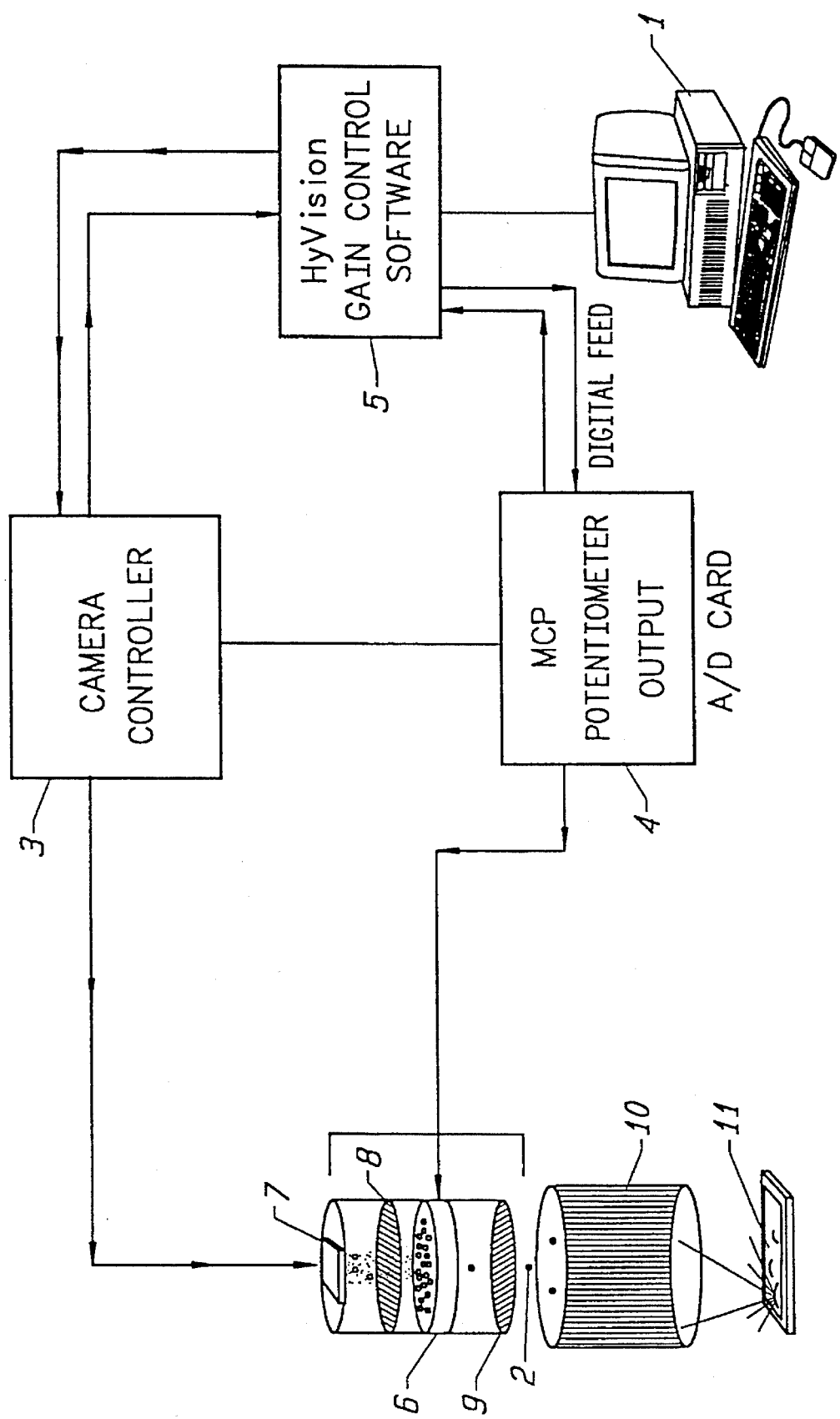
FIG. 5 is a block diagram of the switching gain camera.
Figure 6A:
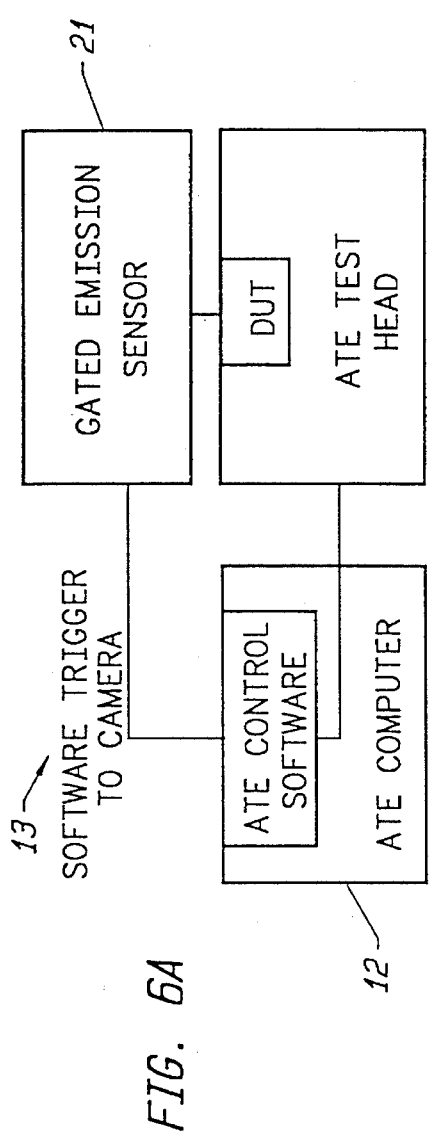
FIGS. 6A–6D are diagrams describing the triggering sequence for the gated Emission Sensor.
Figure 6B:
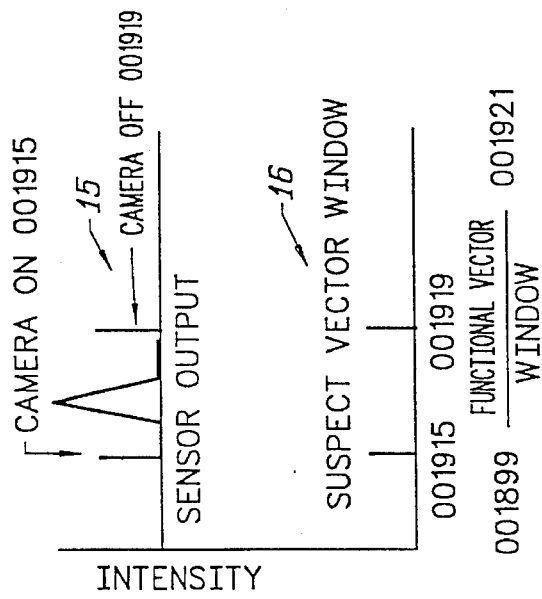
Figure 6C:
Figure 6D:
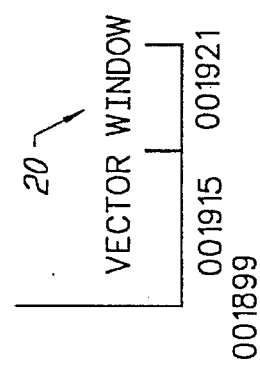
Figure 7:
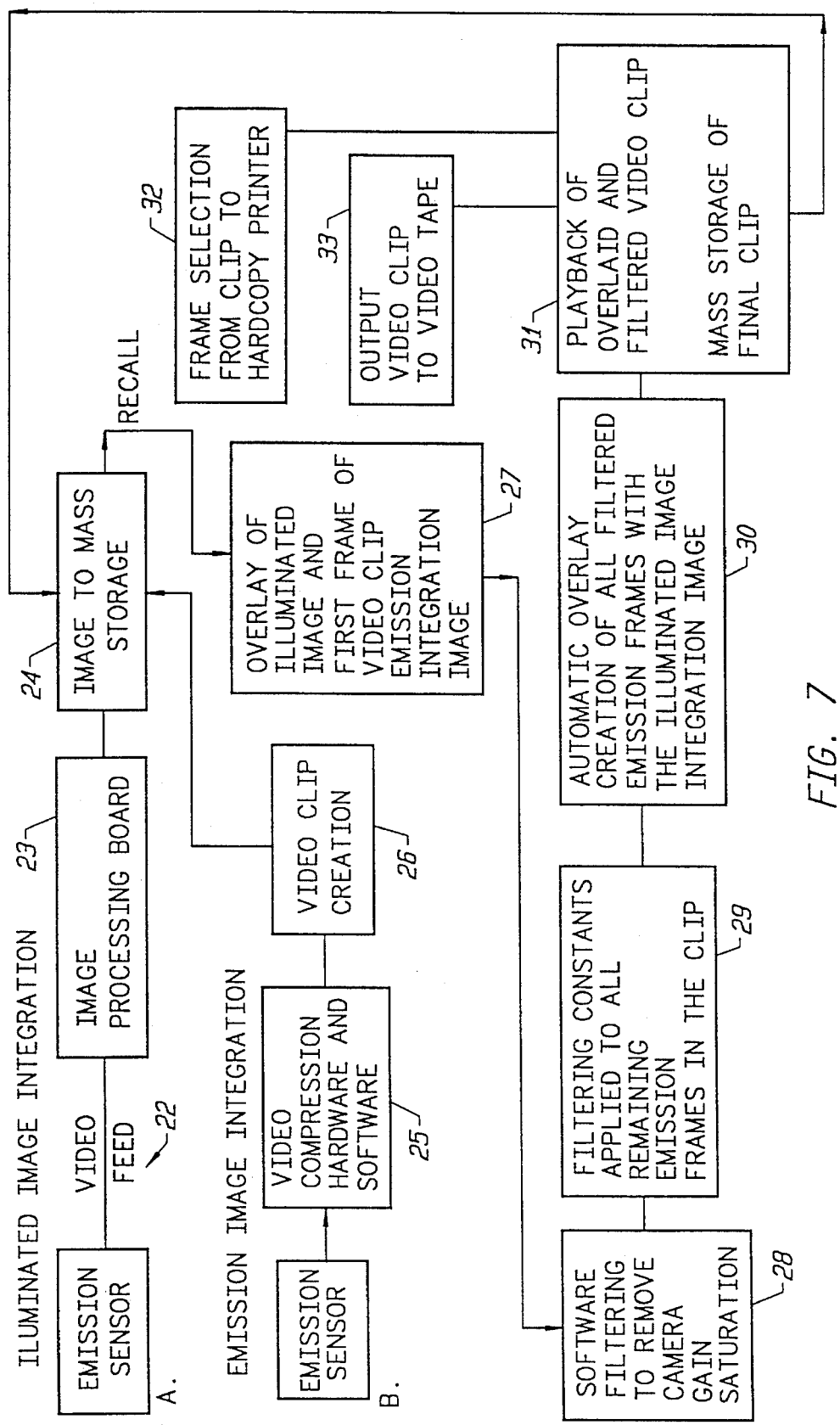
FIG. 7 is a flow diagram describing the video compression, filtering and video clip production in accordance with the invention.
Figure 8:
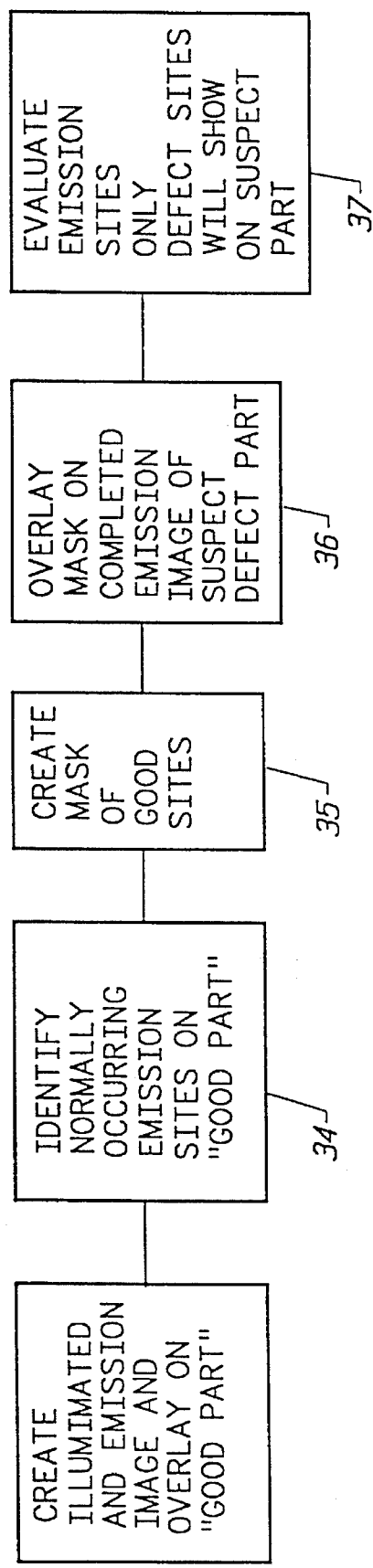
FIG. 8 is a flow diagram describing a masking procedure to mask unwanted emission sites that normally occur and interfere with interpretation of defect sites in accordance with the invention.

In accordance with this invention, an improved emission microscope (FIG. 1) enhances capabilities for detecting in-process and use-related defects in those integrated circuits (typically logic and memory devices) that require both software and parametric test vectors for defect localization. The invention incorporates both a new design and new implementation of the emission microscope which are departures from prior art. The mechanical and signal processing aspects of the preferred embodiment of this invention are generally illustrated in FIGS. 1–8.

The steps of the methods to be implemented for utilization of the invention are outlined below. The utilization of the invention will be readily apparent to a person with skill in the art of semiconductor yield and failure analysis. The description below assumes basic understanding of emission microscope function as set forth in U.S. Pat. Nos. 4,811,090 and 4,680,635. Automated test equipment (ATE) is covered under several prior patents. These large test systems provide software and parametric signals to the semiconductor chip under test. (FIG. 3) These signals are collectively established as a string of software variables (FIG. 6) known as test vectors. 14 A set of test vectors allows the device under test (DUT) 43 to reach various levels of operation. Test strings can vary from hundreds to thousands of vectors, 14 resulting in thousands of lines of code in the software. Without this prior semiconductor conditioning by the ATE equipment, detection of light emission mechanisms related to suspect or failed semiconductors cannot be carried out. The DUT 43 must, in essence, be switched up to a logic state where the defect can be captured and detected by the emission microscope due to the electroluminescent output of silicon.

General steps in the analysis of semiconductor devices by means of this invention.

1. ATE evaluation uncovers test variables outside of design limits (leakage, shorts, etc.), or device is returned failed from the field and sent for re-evaluation on the ATE tester where the variables are discovered.

2. Device under test (DUT) 43 is returned to failure analysis for de capsulation or delidding to expose the die for emission microscopy evaluation.

3. DUT is brought back to the test floor where the ATE equipment resides.

4. A string of test vectors 14 is selected from the entire available set of functional chip variables to switch the device up to the suspect logic state.

5. A variable is added directly before and directly after the suspect event to trigger the emission microscope detector on and off in the ATE test vector string. 15, 16

6. A loop sequence is created allowing the vectors to loop continuously at chip clock rates up to the full operating speed of the chip. 14B, 17, 19

7. A test socket or "daughter board" 43 is mounted on the test head 39 which accepts the exact pinout configuration of the DUT. The DUT is placed in the socket.

8. The transportable docking emission microscope is rolled to the ATE test head. 49

9. The ATE test head is placed in the horizontal face up position. (DUT up.) 41

10. The emission microscope is moved into a position which places the objective set of the microscope directly above the ATE test head. This operation is known as "garaging." FIG. 2A Garage, FIG. 2C Garage 11. An alignment tool is placed on the ATE test head. 66 Pins from this tool align with a docking plate mounted on the bottom of the microscope's vibration isolation table top. 64 Once alignment is established, locking levers 71 operating a CAM mechanism 70 mechanically attach the test head to the emission microscope body. 63

12. A specially developed light tight collar completes the docking arrangement by providing the light-tight enclosure needed for emission testing. 65, 48

13. The emission microscope in this invention has been further modified in that the actual stage is a hole 53 cut into the vibration isolation table. This allows the DUT 43 in its socket to extend into the light tight enclosure. 59 After garaging and docking, (FIG. 2A, FIG. 2B, FIG. 2C) the die face of the DUT 43 is within the focal plane of the objective lens set on the emission microscope. 53

14. The ATE test sequence is next to be initiated. A continuous loop of test vectors is initiated. 14,19 Test vectors reach the DUT and exercise the DUT at real time clock rates. It is important to note that the test vectors are not hampered or distorted by conduction delays; these conduction delays would inevitably occur if the ATE were linked to the emission microscope by cables rather than by the docking mechanism.

15. As the first stage in the emission work, an illuminated image of the DUT is made by using the emission sensor and very low level illumination from a halogen source. (FIG. 1)

16. Next, all lights are extinguished and an emission integration is performed in total darkness. At this time the only source of light to the emission microscope sensor is saturated transistors or light-emitting defect sites in the DUT. (FIG. 1)

17. The emission sensor 55,21 in this invention has been modified to accept triggering commands 12,13 from ATE equipment, within the test vector sequence. A variable activates a switch in software. 14,15,16 This switch tells the emission microscope to turn on and turn off at precise points within the test vector string. 17,19 This switching is critical because many structures in the DUT are capable of emitting light in events leading up to, but not part of, the failure state. The software trigger allows the camera to operate in a stroboscopic fashion. 17,19 As the test variables loop, 14 the camera turns on 15 and off only during the sequence where the suspect damage site is capable of emitting light. 20 By continuously looping the variables and integrating the image, emission spot sites are built up and can be detected. In chips operating at clock speeds of 25 MHz to 100 MHz this occurs thousands of times per second.

18. For static logic defects such as occur in bipolar devices, a further modification and refinement of the image processing is required. Steps 1–17 are repeated. Static logic devices switch into states where they continuously emit light because of their saturated state. Such continuous emission is a normal function of the DUT operating condition. It is important, however, to be able to distinguish between a good device and a defective device. The issue is further complicated by having many emission sites. For these devices, the emission sensor is triggered 12 but is on for longer sequences. The output from the camera is fed to a video compression board (FIG. 7) whose output is multiple frames which collectively act as a short video clip. Software described in U.S. Pat. No. 4,811,090 filters 29 the first image of the clip. The enhancement of this patent 29,30,31 is the automatic filtering of each following frame. The resulting video clip 31 shows the development of emission sites as the logic device turns on.

19. The final steps in the analysis of static logic devices is the utilization of a video mask. (FIG. 8) By selecting a single frame of the video clip from a "good" device, those emission sites (saturated transistors) which normally emit light can be readily identified. The mouse is used to place a cursor over the emission site. The cursor reads the pixel intensity of the emission, compares it to its neighbor, and looks for pixels above the background noise threshold. Once these pixels are identified, they are effectively masked by pixels are taken from the identical location in the illuminated image.

Finally, three points in the illuminated image are selected as reference points. Typically these points are the corners of specific bond pads. Using a triangulation algorithm with these coordinates, a template of the good masked image is precisely overlaid onto a selected frame of the video clip taken from a defective DUT. 34,35,36 By performing image subtraction, only the areas that are defective show emission sites, since the good saturated transistors have been effectively masked out.

20. The defect sites now localized can be evaluated further or deprocessed with focused ion beam or imaged with a scanning electron microscope.

This invention is a departure from prior art in the field of emission microscopy. The invention incorporates a light tight enclosure 59 (enclosing the emission microscope) mounted to the frame of an isolation vibration 52 table which is mounted on large caster-mounted wheels. 49 The width of the table varies with the dimension of the ATE test head it is required to dock to. The caster mounting 49 allows the emission microscope to move about freely on the test floor to the proximity of the test head. A further modification of this emission microscope is the absence of a fixed stage. 53 Where a stage (the focal plane of the objectives) would exist, a twelve inch hole is cut through the vibration isolation tabletop. On the reverse side of the tabletop 63, a docking head plate of the kind used in commercial tester-to-handler interfaces is mounted. This docking plate aligns with pins 68 found on the docking tool 66 attached to the tester head. 39

A further modification is that once the CAM operated levers 71 are activated, a mechanical attachment of the test head and device under test occurs 70, putting the DUT 43 in the focal plane of the objective set of the emission microscope. 53 The CAM locks 70, docking plate and docking head plate are prior art. Claim is made here for the docking interface to an emission microscope. (FIG. 2B docked, FIG. 2D docked) And for the required modification of the docking alignment tools 66 to provide access to the emission microscope objectives 58 of the device under test (DUT). 43

A further modification is the creation of a light-tight flexible silicone rubber collar creating a light-tight mechanically docked interface essential for emission testing. 65 This double collar with recessed faces 48 closes off all light from the emission microscope stage 53 while the locking mechanism 70, 71 establishes a mechanical docking fixing the DUT in the focal plane of the microscope. 53, 58 The final modification recognizes that the tester (FIG. 3) is often placed in a raised floor area, computer room, or positive pressure clean room. The test head 39, once docked, (FIG. 2B docked, FIG. 2D docked) is isolated from vibration 52 often introduced in these environments, and floats on the 80 PSI air bearings 52 of the table while maintaining a fixed position for the device under test in respect to the objectives 58 as the emission microscope is firmly attached to the topside of the isolation table top 54.

Further, since the enclosure is not mounted to the isolation tabletop 59, it cannot introduce vibration. Thus accidental jostling as can occur in the busy and cramped environment of the test floor will not affect the outcome of the analysis.

A departure from prior art is the direct access of the emission microscope objectives to the die face of the DUT. 43 The DUT is mounted in its socket attached to the test head which is in turn attached to the tester. Prior art has utilized cable sets to bring test vectors from the test head to the socket placed beneath the emission microscope. These cable sets create conduction timing delays and force the DUT to be exercised at speeds significantly below its true clock speeds. Often, smaller testers have been used which attempt to approximate the test vectors used on the ATE equipment. The combination of different test software, conduction delays and conduction delay deconvolution algorithms (used in attempt to overcome the delay problem) often make test reproduction difficult. The issue of a cable "bundle" raises immediate concerns for proper pin and connector setup and continuity issues. All of these cable sets are custom made and require significant outlays of time to develop since each lead must be cut to exact specification in an effort to approximate conduction delays. This invention eliminates the conduction variables, software translation and software variability issues. It also eliminates the expense and effort of developing and maintaining cable sets. Since semiconductor manufacturing sites often make tens or even hundreds of different semiconductor products, developing and maintaining the above mentioned software and cable sets is a substantial undertaking. By docking to the test head directly (FIG. 2A docked, FIG. 2B docked), the invention can utilize all existing software and test fixtures (sockets) and achieve full conduction clock speeds without any further development.

Two modifications of the camera (FIG. 5, FIG. 6) are embodied in this invention to achieve the needed performance unique to this kind of automated analysis. This first modification and departure from prior art is the use of a switching gain camera. (FIG. 6) This is essential to detect dynamic transient events. Image intensifiers utilizing Ga-As photo cathodes 9 rely upon secondary amplification provided by a micro channel plate. 6 This plate 6 is charged and acts much like the grid in cathode tube technology. Single photons are converted to electrons 9 by the photo cathode 9 and go on to be amplified by the micro channel plate in a shower of electrons. 6 They are then shot into a bed of phosphors 8, turning the single photon into hundreds of photons that are detected by the CCD chip. 7 In the illuminated mode, this amplification step is fixed at the high level desired for low photon detection. It produces image distortion. The modification of this invention created a switching gain camera. The analog circuit gain 4 of the micro channel plate is fed to an A/D converter. The digital feed from this is utilized in the software 5 to create from 0 to 255 selectable gain steps to the micro channel plate. The user selects low gain settings compatible with his analysis for illuminated testing. The software stores these offsets and automatically recall them when an illuminated image is made. 3,7 The result is an image having low noise and low distortion. When an emission image is selected, the camera automatically is switched to high gain. High gain maximizes the detection of low photon count emissions from the device under test.

The second modification is the utilization of a trigger on the camera. The camera receives a software command embedded in the test vector sequence of the ATE equipment. 12,13,21 This command tells the camera when to turn on and when to turn off. 15,16 This creates a stroboscopic effect. 17,19 The camera turns on only during the sequence of test vectors where the suspect emissions are anticipated to occur. 14,16 When testing chips having clock speeds up to 100 MHz, this occurs right up to the 60 frames per second capability that represents the current frame capture ability of CCDs. By integrating over several seconds or tens of seconds, an emission spot or spots can be localized. The departure from prior art is the attachment by software command to the ATE tester. 14 Transient dynamic defects would turn on only for an instant and be undetectable without such a tool. By moving the on, off "window" or gate 20 it is possible to narrow down to the few test vectors responsible for the emission. This provides a significant reduction in test time as the defect site and its related parametric and software vector responsible for the defect can be isolated by this technique. 14,16,20

A further modification which departs from prior art is the development of a set of specific tools to enhance detection and data presentation on static logic devices. Static logic devices such as bipolar ICs emit light when in saturation; this is a normal function of the device and produces a forward bias emission which is readily detectable by the sensor. For analysis of these devices, two types of data are needed: the sequence of steps as the device turns on, and the comparison of a good device and a bad device. Analysis is further complicated by the fact that many light-emitting sites are not defective. This necessitates a comparative process. Further, many types of devices can develop latching conditions where adjacent PN junctions forward bias one another, resulting in a runaway reaction that ultimately results in chip failure. The sequencing of this latchup is essential and in logic devices may only be reached when a significant number of test vectors are used to push the chip into a latchup state.

A further modification (FIG. 7) proposed to meet these requirements is the output of the sensor to a video compression board. 25 Software previously described 28 in U.S. Pat. No. 4,811,070 filters the first image but a further enhancement and departure from the current state of the art is the subsequent video compression 25 and real time filtering 29 of the subsequent frames. This allows a video clip to be played back from a removable hard disk 31 or other mass storage device. The video clip documents the sequence and progression of the emission events occurring on the chip face. A series of still frames that can then be played back in progression as a video clip 31 showing the progression of static defects that lead to the failure state. This technique is further enhanced when used in conjunction with the triggered camera (FIG. 6) as a direct correlation can be established to the test vector responsible for the emission site. 14,15,16,20 This is simply accomplished by removing the window 20 of the trigger until the event is extinguished.

To deal with emission sites that are not defective and may confuse the interpretation of data, a video mask enhancement is required. (FIG. 8) This modification departs from prior art in that it reads the pixel intensity of an emission site pointed out by the user with a cursor. The identified pixel is compared to its neighbors; the software looks for pixels that stand above the background level. Once identified, these pixel sites are replaced in software pixel for pixel with the illuminated image pixels. This effectively produces a mask of all unwanted emissions. The analysis is performed on a good non-defective device.

Finally, the user selects three points of reference for triangulation. These are typically the corners or edges of the die or the edges of specific bond pads. With three sites identified, a template is formed. 34 A frame taken from the video clip of a defective device is also selected. 35 Three points are identified matching those on the good part. The two images can now be perfectly aligned in the computer. 36 The masked image is now placed on top of the unmasked defective device image. An image overlay is performed. 36 The result is an image showing only the emission sites related to the damage on the device. 37 The normally saturated device is masked out.

What is claimed is:

1. A transportable Emission Microscope for use with test heads in Automatic Test and Evaluation (ATE) equipment in detecting process and use related defects in semiconductor devices that require both software and parametric test vectors for functional in-use testing for defect localization, said Emission Microscope comprising;

means for mounting said emission microscope in a transportable structure, means for accessing the emission microscope and an emission sensor to a semiconductor device under test (DUT) on an Automatic Test and Evaluation (ATE) test head, with the test head of the automatic test and evaluation equipment being garaged within the emission microscope, means for docking the test head of the Automatic Test and Evaluation equipment to the emission microscope directly within the focal plane of the emission microscope for improved isolation from external vibration and, means for forming a light tight collar around the Automatic Test and Evaluation equipment test head, the docking mechanism and said DUT.

2. An Emission Microscope as in claim 1 wherein said emission sensor is switched on and off by source code software commands from said Automatic Test and Evaluation equipment, the software commands triggering the operation of the gated emission sensor over time and isolating the test variables causing a given emission.

3. An Emission Microscope as in claim 1 wherein initial signal gain is controlled by a programmable image intensification tube.

4. An Emission Microscope as in claim 3 wherein said image intensification tube switches automatically from low signal gain in illumination mode to high signal gain in emission mode.

5. An Emission Microscope as in claim 1 wherein data is output from said emission sensor to a video compression board from which video compression board the data is periodically transferred to a mass storage device from which the data can be retrieved and viewed as video clip in which the first and all subsequent emission images are automatically overlaid on a single illuminated image and in which filtering of the first frame of the emission video clip is automatically applied to all subsequent video frames within the video clip allowing playback of an overlaid and filtered video clip sequence of an emission event.

6. An Emission Microscope as in claim 5 wherein coordinate triangulation is used to locate sites on two semiconductor devices, one with normal emissions and one with emissions resulting from defects, and wherein the two resulting dissimilar images can be precisely overlaid to create a masking function wherein the good emission image is used to provide the mask resulting in the display of emissions from defect sites only on the suspect defective device.

* * * * *